United States Patent [19]

Luther et al.

[11] 4,208,783

[45] Jun. 24, 1980

[54] METHOD FOR DETERMINING THE OFFSET BETWEEN CONDUCTOR PATHS AND CONTACT HOLES IN A CONDUCTOR PLATE

[75] Inventors: Erich Luther, Ronnenberg; Martin Maelzer, Wunstorf, both of Fed. Rep. of Germany

[73] Assignee: Luther & Maelzer GmbH, Wunstorf, Fed. Rep. of Germany

[21] Appl. No.: 919,486

[22] Filed: Jun. 27, 1978

[30] Foreign Application Priority Data

Mar. 23, 1978 [DE] Fed. Rep. of Germany ....... 2812976

[51] Int. Cl.$^2$ ............................................... H05K 3/10
[52] U.S. Cl. ...................................... 29/593; 29/625; 29/852
[58] Field of Search ................... 29/593, 624, 630 R, 29/630 D, 407, 625, 626

[56] References Cited

U.S. PATENT DOCUMENTS

| | | | |
|---|---|---|---|
| 3,388,457 | 6/1968 | Totta | 29/593 |
| 3,448,280 | 6/1969 | Blitchington | 29/407 |
| 3,564,114 | 2/1971 | Blinder | 29/625 |
| 3,859,711 | 1/1975 | McKiddy | 29/593 |

Primary Examiner—Carl E. Hall
Attorney, Agent, or Firm—Owen, Wickersham & Erickson

[57] ABSTRACT

A conductor plate and a method for determining the offset between conductor paths and contact holes in the conductor plate. Conductor paths with contact eyes and at least one control mark are simultaneously applied, and, in a later step, contact holes and a control hole for each control mark are simultaneously punched through the conductor plate. Then the position of the control hole is determined relative to its associated control mark. The control mark has at least one curved control path which encloses, on at least one side, a control area of the conductor plate; the control hole is centrally located within the control area when the contact holes are centrally located within their associated contact eyes. Preferably, there are two control marks disposed diagonally opposite each other and pointing in different directions. Each control mark may comprise a group of control paths disposed within one another.

5 Claims, 11 Drawing Figures

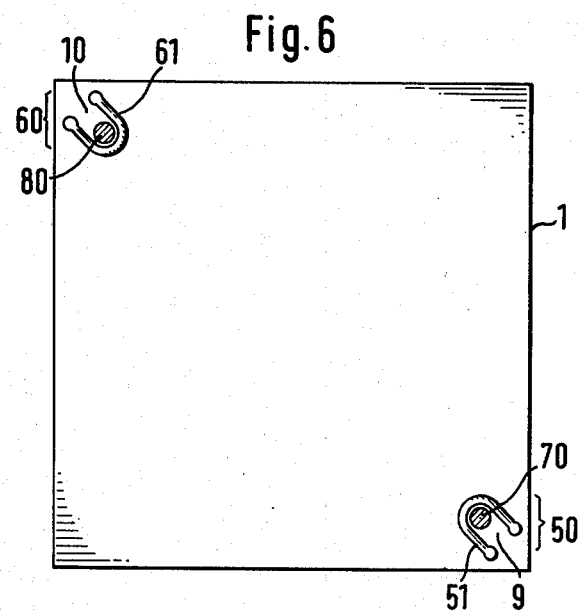
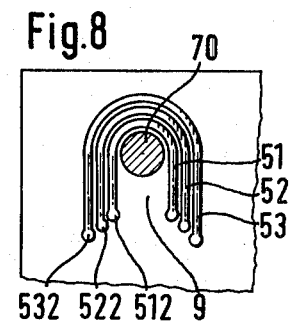
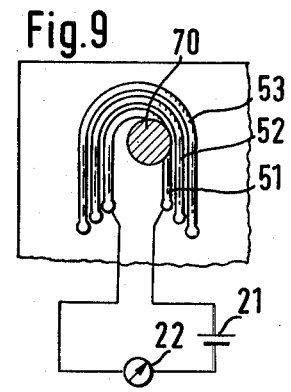
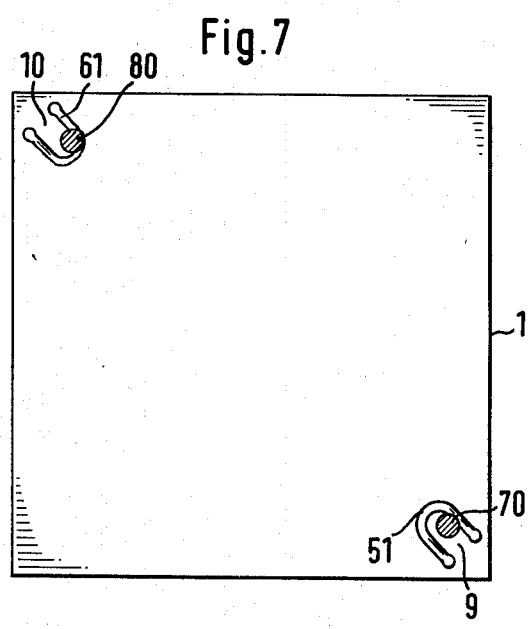
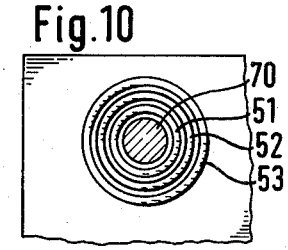
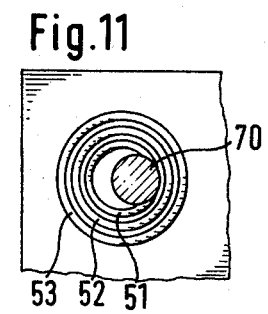

4,208,783

METHOD FOR DETERMINING THE OFFSET BETWEEN CONDUCTOR PATHS AND CONTACT HOLES IN A CONDUCTOR PLATE

BACKGROUND OF THE INVENTION

The invention relates to a method for determining the offset between conductor paths and contact holes in a conductor plate. The invention also relates to a conductor plate for use with this method.

In the reproduction of printed circuits for the electronics industry, components are inserted with their contact pins into a conductor plate and soldered there, so that a finished electronic circuit is obtained. To produce this type of conductor plate, conductor paths are applied onto plates made of electrically insulating material, using, for example, a galvanic method. At the places provided for the connecting pins of the components which are to be soldered-in, the conductor paths are usually widened to form contact eyes. In a further and separate operational step, the contact holes for the components which are to be inserted are bored or punched into the contact eyes at the intended locations. Application of the conductor paths and the punching or boring of the holes is thus not done in the same operational step, but at different times, one step following the other. As a result, offsetting can occur between the position of the actual punched contact holes and their ideal position on the conductor plate.

Considerable disadvantages are connected with such offsetting. For example, the contact hole may intercept and interrupt the minimum rim of the conductor path, so that there is no longer any assurance that, when a component is soldered-in, the pin of this component which is located in that contact hole is securely united by soldering with the contact eye of the conductor path. If the offset is very large, the contact hole may even be located outside the contact eye, and thus no conducting connection will be achieved by soldering between the component and the associated conductor path.

A further disadvantage of offsetting is that during the automatic application of the component parts to the conductor plate by the component machine, the connecting pins of the component to be inserted are lined up according to a component pattern which corresponds to the pattern of the conductor plate rather than to the pattern of the punched contact holes. As a result, when there is an offset between the conductor paths and the punched or bored contact holes, the connecting pins of the components may be inserted into the conductor plate adjacent rather than in the holes. This results in these connecting pins not being soldered together in the solder bath with the proper conductor path. Further, when a contact pin is mounted adjacent a contact hole, the contact pin may also become bent, so that the component is no longer suitable for automatic application.

There is, therefore, a need for a method with which the offset between conductor paths and contact holes in a conductor plate may be determined and taken into account.

One object of the present invention is to provide a method for determining the offset between conductor paths and contact holes in a conductor plate.

Another object is to provide a method for recognizing an offset in a conductor plate which exceeds the tolerance limits, so that such a conductor plate can be automatically eliminated in the manufacturing process.

Another object is to provide a conductor plate with which such methods may be carried out.

Other objects and advantages of the invention will appear from the following description.

SUMMARY OF THE INVENTION

The present invention for determining the offset between conductor paths and contact holes in a conductor plate, comprises three basic steps: first, simultaneously applying conductor paths with contact eyes and at least one control mark onto the conductor plate; second, in a later step, simultaneously punching contact holes and a control hole for each control mark through the conductor plate; and third, determining the position of the control hole relative to it associated control mark.

The control mark typically has at least one curved control path which encloses on at least one side a control area of the conductor plate, such that the control hole is centrally located within the enclosed control area when the contact holes are centrally located within their associated contact eyes. The diameter of the control hole as punched may be larger than the width of the control path used for the control mark. The distance between the edge of the control hole in its fully centered position to the outer edge of the control path may be equal to the given tolerance limit of the offset, or the width of the control path may be equal to the tolerance limit of the offset.

The control hole may be circular, and the control path may be provided with a circularly curved area, disposed concentrically relative to the fully centered position of the control hole on the conductor plate. The control mark may have a U-shaped control path, or the path may be a circle.

Preferably, there are two control marks, disposed diagonally opposite each other. The control marks may be disposed so that the directions of their U-shaped form are vertical in relation to each other, or the control marks may be disposed so that the directions of their U-shaped form are opposed to each other.

Each control mark may comprise a group of control paths disposed within one another. The group may comprise equidistant control paths of equal width. The control marks may comprise a plurality of concentric circles or a plurality of concentric U-shaped paths.

The control marks may comprise control paths with contact points at their ends.

The determining step may comprise optically determining the position of the control hole relative to the control path of a control mark. Alternatively, the control paths may be made from electrically-conducting material.

A conductor plate and control paths may be made of the same material as the conductor paths of the conductor plate. The determining step is done by checking the electric resistance of the control paths, as by applying a voltage source to the contact points of a control path, and measuring the current flowing through the control path.

The conductor plate of this invention will thus have thereon a plurality of conductor paths, at least one control mark comprising at least one control path enclosing a control area, and a control hole located within or near the control area.

Preferably, there are two control marks and two control holes, which are disposed on the conductor plate diagonally opposite each other.

The invention is described and explained in further detail hereinbelow in connection with an embodiment and the drawings.

BRIEF DESCRIPTION OF THE DRAWINGS

In the drawings:

FIG. 6 is a schematic plan view of a control plate with two U-shaped control marks and their associated control holes.

FIG. 7 is a view similar to FIG. 6 showing the relative position of control holes and control marks, when an offset occurs in relation to FIG. 6.

FIG. 8 is another detail view showing a control mark comprising three U-shaped control paths, the control hole being in its ideal position.

FIG. 9 is a view similar to FIG. 8, having a control mark in accordance with FIG. 8 but with the control hole offset in relation to its ideal position and showing how the amount of this offset can be determined.

FIG. 10 is another detail view showing another type of control mark comprising three concentric control paths in whose center the control hole is located in its ideal position.

FIG. 11 is a view similar to FIG. 10 showing the control mark corresponding to FIG. 10, with the control hole offset from its ideal position.

FIG. 1 shows a control plate 1 with conductor paths 2 as well as with control marks 50 and 60 in accordance with the invention. The conductor paths 2 have contact eyes 3 in whose center the contact holes 4 are punched or bored. In the corners of the conductor plate, diagonally opposed control marks 50 and 60 are provided which, in the example shown there, comprise control paths 51 and 61, respectively. These control marks are open toward a U-shaped side, and in the area enclosed by the control paths 51, 61, control holes 70 and 80 are respectively provided.

FIG. 1 illustrates the case in which the contact holes 4 and the control holes 70,80 are punched or bored free of offset. FIG. 2 shows, in an enlarged cutout, a contact hole 4 in its ideal position within a contact eye 3 on a conductor path 2. When an offset has occurred, as shown in FIG. 3, a piece of the conducting material of the contact eye 3 has been punched out through the contact hole 4, so that there remained less than the required minimum width of the metalizing rim of the contact eye 3. FIGS. 4 and 5 show clearly that such an offset also affects, to the same extent, the position of the control hole 70 in relation to the control path 51. In the example shown there, the control hole 70 is circular, and the control mark is a closed annular control path 51 which in its ideal position (FIG. 4) concentrically surrounds the contact hole 70. Instead of a circular or ring shape for the contact hole and the control path, it is, however, also possible to choose various other geometrical shapes. The diameter of the control hole 70 in the example shown in FIGS. 4 and 5 is of the same order of magnitude as the diameter of a contact hole 4, the outer diameter of the control path 51 being of the order of magnitude of the diameter of a contact eye 3.

Figure 1:
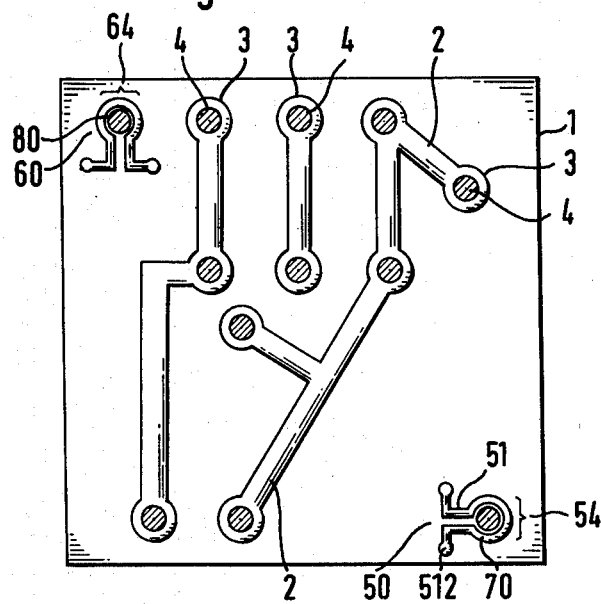
FIG. 1 is a plan view of a conductor plate embodying the principles of the invention with conductor paths and contact holes which are provided, in accordance with the invention, with control marks and control holes.
Figure 2:
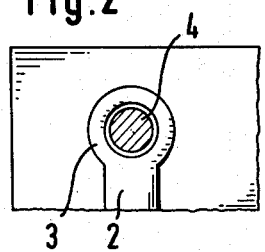
FIG. 2 is an enlarged detail view of a portion of a conductor plate having a contact hole in its ideal position in the center of a contact eye.
Figure 3:
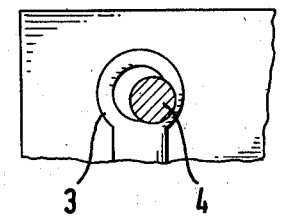
FIG. 3 is a similar view of a different plate having a contact hole which is offset within a contact eye instead of being in its ideal position.
Figure 4:
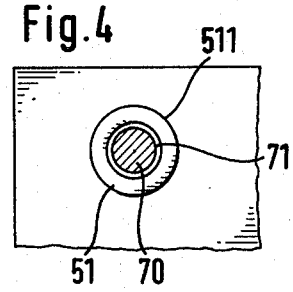
FIG. 4 is a similar view showing a contact hole in the center of a circular control mark.
Figure 5:
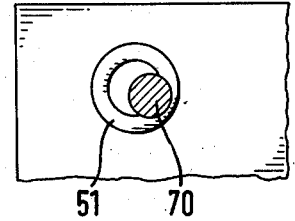
FIG. 5 is a view like FIG. 4 showing how, because of offset, the control hole is offset in relation to its ideal position and thus against the control mark.

The control marks 50 and 60 shown in FIG. 1 are suitable for determining the offset electrically. The contact path 51 forming the control mark is not closed but open. If, because of an offset, the control holes 70 break through this control path 51, the conducting connection between their ends is interrupted. This may be determined, for example, by a voltage source 21 (as in FIG. 9) applied to the ends of the control path 51 which, if desired, may be widened to form contact points 512, and the current flowing through the control path 51 is measured with a measuring instrument 22, as in FIG. 9. If no current flows through the control path 51, then the offset of the control hole 70 has exceeded a specific tolerable value. This value is suitably selected corresponding to the admissible tolerance limit of the offset. When the outer diameter of the control hole 70 and the inner diameter of the curved portion of the control path 51 are substantially equal, then the width of the control path 51 thereby determines the tolerance.

It it is intended to determine with electrical means whether the admissible limit of offset has been exceeded, the control path 51 or 61 must extend between two feed points and cannot, therefore, be closed on itself, but must be open on one side. If, as a result of the offset, the control hole moves into this open side, the offset cannot be determined exactly if only one control mark is used. For this reason, in accordance with an advantageous embodiment of the invention, two control paths with one associated control hole each are provided on the conductor plate, the direction of the open areas of the control paths being displaced in relation to each other, preferably by an angle of 90°, as shown in FIG. 1. With such an aarrangement, it is also possible to determine an offset resulting from rotation of the conductor plate about a control hole. If only one control mark is used, such an offset could not be determined.

For the electrical determination of the punching offset, the diameter of the control hole must be at least as wide as the control path. As a practical matter, it is selected to be larger, so that, when the offset is inadmissibly large, the control hole penetrates through the control path and thereby interrupts the conducting connection between its terminal points. The distance between the edge 71 of the control hole 70 in its fully centered position to the outer edge 511 of the control path 51 should be equal to a given tolerance limit of the offset.

FIGS. 6 and 7 show a further embodiment in accordance with the invention in which two control marks 50 and 60, respectively, are mounted on a conductor plate 1 in diagonally opposite corners. These control marks 50 and 60 consist of control paths 51 and 61, respectively, curved in U-shaped, and enclosing the control areas 9 and 10, respectively, of the conductor paths. When the control holes 70 and 80 are in their ideal position, they are surrounded by the control paths 51 and 61, respectively, in a semicircle. In order for it to be possible to determine the punching offset satisfactorily, the open sides of the U-shape of these control paths lie in directions opposite to each other. FIG. 7 illustrates a situation in which the offset of the control hole 70 is still below the tolerance limit, so that there still is a conducting connection between the ends of the control path 51, while the offset of the control hole 80 has reached the tolerance limit, so that the control path 61 is interrupted by the control hole 80; hence, when that conductor plate is examined, it can be automatically eliminated.

The control marks described above which comprise only one control path are suitable only for determining whether or not the tolerance limit has been exceeded. In many cases, however, it is necessary to know the amount by which the tolerance limit has been exceeded. A further embodiment of the invention solves this problem by providing a plurality of control paths for each control mark, the control paths lying within each other and being preferably equidistant from each other. Such control marks are shown in FIGS. 8 to 11.

FIG. 8 shows an assembly of control paths 51,52,53, which are U-shaped and disposed within each other. These control paths are preferably all of the same width and are disposed at equal distances from each other. The ends of the control paths 51,52,53 may be widened to form contact points 512,522,532 respectively.

FIG. 9 shows a situation in which the control hole has been moved out of its ideal position because of a punching offset and interrupts the control path 51. This is determined in the manner already described, with the aid of a voltage source 21 and a measuring instrument 22. When the control hole 70 is moved further out of its ideal position in relation to the example shown in FIG. 9, for example, by more than twice the tolerance limit, then the control path 52 is also interrupted by this control hole 70. This can be determined electrically in the same manner as in the case of the control path 51. In the event of an even greater offset of the control hole, the control path 53 is finally broken through which can also be determined electrically. In this manner, it is possible with simple means to determine any offset of the control holes and thereby of the control holes in relation to the associated conductor paths and to measure them with electric means, since the widths of the control paths and their spacing from each other are known.

FIGS. 10 and 11 additionally show a further embodiment for the control mark which also comprises three control paths 51,52,53, but said control paths being circular rings. In the ideal position, the control hole 70 is located in the center of said circular rings (FIG. 10). When an offset occurs, the control hole 70 cuts through one ring 50 (FIG. 11) or even several of the circular rings. This can be determined optically, for example, with a microscope.

As already mentioned, the width of the tolerance can be determined by the width of the individual control paths. If, for example, the diameter of a contact hole is 1 mm, and if it is intended to punch each contact hole with a precision of 0.1 mm within a contact eye, then the width of a control path is selected at 0.1 mm. The diameter of the control hole is, for example, 1 mm. If, according to the example shown in FIGS. 8 and 9, it is intended not only to determine whether an admissible value of offset has been exceeded or fallen short of, but in addition it is to be determined how large the offset is, then the diameter of an individual control path is selected to be, for example, 0.05 mm, and the distance of the control paths from each other at 0.1 mm. It is, of course, also possible to choose an embodiment in which the width of the control paths and/or the distances of the control paths from each other, increase or decrease from the inside outwardly. The individual measurements for the spacing of the control paths and their width will depend on the tolerance limits desired at any particular time and on the other requirements.

It should further be mentioned that in individual cases, the control paths used for the control marks may be used, similarly to the conductor paths, also as electric connections for a circuit.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. A method for determining the offset between conductor paths and contact holes in a conductor plate, comprising:
   (a) simultaneously applying the conductor paths, with contact eyes, and at least a control mark onto the conductor plate, said control mark having at least one control path which has a circularly curved portion and encloses, on at least one side, a control area,
   (b) in a later step simultaneously punching contact holes and a control hole for each control mark through the conductor plate, the predetermined position of the control hole being within the enclosed control area, characterized in that the distance between the edge of the control hole in its predetermined position to the outer edge of the control path is selected to be equal to a given tolerance limit of the offset, and that the diameter of the control hole is larger than the width of the control path of the control mark.

2. A method in accordance with claim 1, wherein the width of the control path is selected to be equal to the given tolerance limit of the offset.

3. A method for determining the offset between conductor paths and contact holes in a conductor plate, comprising:
   (a) simultaneously applying the conductor paths, with contact eyes, and a plurality of control marks onto the conductor plate, applying each control mark as a group comprising a plurality of concentric circles each of which encloses a control area of the conductor plate,
   (b) in a later step, simultaneously punching contact holes and a control hole for each control mark through the conductor plate, the control hole being centrally located within the enclosed control area when the contact holes are centrally located within their associated contact eyes, and
   (c) determining the position of the control hole relative to its associated control mark.

4. A method for determining the offset between conductor paths and contact holes in a conductor plate, comprising:
   (a) simultaneously applying the conductor paths, with contact eyes, and a plurality of equidistant control marks of equal width onto the conductor plate, applying each control mark as a plurality of concentric circles each of which encloses a control area of the conductor plate, (b) in a later step, simultaneously punching contact holes and a control hole for each control mark through the conductor plate, the control hole being centrally located within the enclosed control area when the contact holes are centrally located within their assoicated contact eyes, and (c) determining the position of the control hole relative to its associated control mark.

5. A method according to either of claims 1 or 4, characterized in that electrically conducting material is used for the control marks and that by means of a voltage source applied to the ends of each control path and measuring the current flow it is checked whether a control path is interrupted by the control hole.

* * * * *